US012392036B1

(12) United States Patent
Seaman et al.

(10) Patent No.: US 12,392,036 B1
(45) Date of Patent: *Aug. 19, 2025

(54) INLINE CODEPOSITION MODULAR MULTI-FLUX EVAPORATION SOURCE WITH INTEGRATED REACTIVE VAPOR MANIFOLD

(71) Applicant: HelioSourceTech, LLC, Tucson, AZ (US)

(72) Inventors: Walter Seaman, Tucson, AZ (US); Billy Jack Stanbery, Austin, TX (US)

(73) Assignee: HelioSourceTech, LLC, Tucson, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/677,815

(22) Filed: Feb. 22, 2022

Related U.S. Application Data

(60) Provisional application No. 63/161,038, filed on Mar. 15, 2021.

(51) Int. Cl.
*C23C 16/448* (2006.01)
*C23C 16/06* (2006.01)
(Continued)

(52) U.S. Cl.
CPC ........ *C23C 16/45561* (2013.01); *C23C 16/06* (2013.01); *C23C 16/4485* (2013.01);
(Continued)

(58) Field of Classification Search
None
See application file for complete search history.

(56) References Cited

U.S. PATENT DOCUMENTS

| 2,665,223 A * | 1/1954 | Clough ............... C23C 14/243 |
| | | 266/200 |
| 2010/0159132 A1* | 6/2010 | Conroy ............... C23C 14/562 |
| | | 118/726 |
| 2013/0112288 A1* | 5/2013 | Liu ..................... C23C 14/243 |
| | | 137/334 |

FOREIGN PATENT DOCUMENTS

WO   WO-2020110055 A1 *  6/2020  ............. C23C 14/14

* cited by examiner

*Primary Examiner* — Alexander M Weddle

(57) ABSTRACT

A method includes directing a first flux plume from a first evaporation source to a first reactive codeposition zone; directing a first vapor flux plume from a first vapor distribution manifold to the first reactive codeposition zone, wherein the first vapor distribution manifold is integrated with the first evaporation source to form a first integrated evaporation and vapor distribution manifold; directing a second flux plume from a second evaporation source to a second reactive codeposition zone; and directing a second vapor flux plume from a second vapor distribution manifold to the second reactive codeposition zone, wherein the second vapor distribution manifold is integrated with the second evaporation source to form a second integrated evaporation and vapor distribution manifold. An apparatus includes an inline reactive codeposition modular multi-flux evaporative source with integrated vapor manifold system comprising a first integrated evaporation and vapor distribution manifold including a first evaporation source emitting, when in operation, a first flux plume toward a first reactive codeposition zone; and a first vapor distribution manifold integrated with the first evaporation source, the vapor distribution manifold emitting, when in operation a first vapor flux plume toward the first reactive codeposition zone; and a second integrated evaporation and vapor distribution manifold including a second evaporation source coupled to the first evaporation source, the second evapo-
(Continued)

ration source emitting, when in operation, a second flux plume toward a second reactive codeposition zone; and a second vapor distribution manifold integrated with the second evaporation source, the second vapor distribution manifold emitting, when in operation a second vapor flux plume toward the second reactive codeposition zone.

11 Claims, 4 Drawing Sheets

(51) Int. Cl.
  *C23C 16/455* (2006.01)
  *C23C 16/52* (2006.01)
  *H10F 77/12* (2025.01)
(52) U.S. Cl.
  CPC ........ *C23C 16/45563* (2013.01); *C23C 16/52* (2013.01); *H10F 77/126* (2025.01)

INLINE CODEPOSITION MODULAR MULTI-FLUX EVAPORATION SOURCE WITH INTEGRATED REACTIVE VAPOR MANIFOLD

CROSS-REFERENCE TO RELATED APPLICATION

Referring to the application data sheet filed herewith, this application claims a benefit of priority under 35 U.S.C. 119 (e) from provisional patent application U.S. Ser. No. 63/161,038, filed Mar. 15, 2021, the entire contents of which are hereby expressly incorporated herein by reference for all purposes.

BACKGROUND

Evaporation sources are often used to deposit high quality complex materials such as compound alloy coatings on product substrates that are within or passing through sequential reaction chambers. These processes often utilize reactive codeposition of multiple precursor fluxes evaporated from separate source reservoirs operating at very different temperatures to achieve optimal reactant ratios at the growing film's surface. A common approach is to position the higher operating temperature sources entirely within the reaction vessel with sufficient precursor supply to operate continuously between scheduled preventive maintenance shutdowns, while using remote reservoirs for the lower evaporation temperature materials to reduce the reactor's internal volume. A gas manifold within the processing vessel is then utilized to distribute the lower evaporation temperature vapor from the external source material reservoir. Operational deposition rates using this approach must be limited to achieve acceptable film quality and uniformity while minimizing coating of interior surfaces other than the product substrate, which results in wasted raw materials and buildup of debris that can detach and generate defects in the product coating. Tool shutdown for periodic cleaning to recover yield reduces its availability for production. These deficiencies of this conventional approach to reactive codeposition of coatings increase operating expenses, waste, and product costs.

Heretofore, the requirements of increasing deposition rates, minimizing undesirable coating of interior surfaces and buildup of debris, and reducing tool shutdown referred to above have not been fully met. In view of the foregoing, there is a need in the art for a solution that simultaneously solves all of these problems.

SUMMARY

There is a need for the following embodiments of the present disclosure. Of course, the present disclosure is not limited to these embodiments.

According to an embodiment of the present disclosure, a process comprises: directing a first flux plume from a first evaporation source to a first reactive codeposition zone; directing a first vapor flux plume from a first vapor distribution manifold to the first reactive codeposition zone, wherein the first vapor distribution manifold is integrated with the first evaporation source to form a first integrated evaporation and vapor distribution manifold; directing a second flux plume from a second evaporation source to a second reactive codeposition zone; and directing a second vapor flux plume from a second vapor distribution manifold to the second reactive codeposition zone, wherein the second vapor distribution manifold is integrated with the second evaporation source to form a second integrated evaporation and vapor distribution manifold.

According to another embodiment of the present disclosure, a machine comprises: an inline reactive codeposition modular multi-flux evaporative source with integrated vapor manifold system comprising a first integrated evaporation and vapor distribution manifold including a first evaporation source emitting, when in operation, a first flux plume toward a first reactive codeposition zone; and a first vapor distribution manifold integrated with the first evaporation source, the vapor distribution manifold emitting, when in operation a first vapor flux plume toward the first reactive codeposition zone; and a second integrated evaporation and vapor distribution manifold including a second evaporation source coupled to the first evaporation source, the second evaporation source emitting, when in operation, a second flux plume toward a second reactive codeposition zone; and a second vapor distribution manifold integrated with the second evaporation source, the second vapor distribution manifold emitting, when in operation a second vapor flux plume toward the second reactive codeposition zone.

These, and other, embodiments of the present disclosure will be better appreciated and understood when considered in conjunction with the following description and the accompanying drawings. It should be understood, however, that the following description, while indicating various embodiments of the present disclosure and numerous specific details thereof, is given for the purpose of illustration and does not imply limitation. Many substitutions, modifications, additions and/or rearrangements may be made within the scope of embodiments of the present disclosure, and embodiments of the present disclosure include all such substitutions, modifications, additions and/or rearrangements.

BRIEF DESCRIPTION OF THE DRAWINGS

The drawings accompanying and forming part of this specification are included to depict certain embodiments of the present disclosure. A clearer concept of the embodiments described in this application will be readily apparent by referring to the exemplary, and therefore nonlimiting, embodiments illustrated in the drawings. The described embodiments may be better understood by reference to one or more of these drawings in combination with the following description presented herein. It should be noted that the features illustrated in the drawings are not necessarily drawn to scale.

FIG. 1A is an elevation cross section and FIG. 1B is a bottom view looking through the substrate of exemplary inline reactive codeposition evaporation sources with integrated reactive vapor manifolds.

FIG. 2A is an elevation cross section and FIG. 2B is a bottom view looking through the substrate of exemplary integrated modular multi-flux evaporation source assembly.

DETAILED DESCRIPTION

Figure 1A:
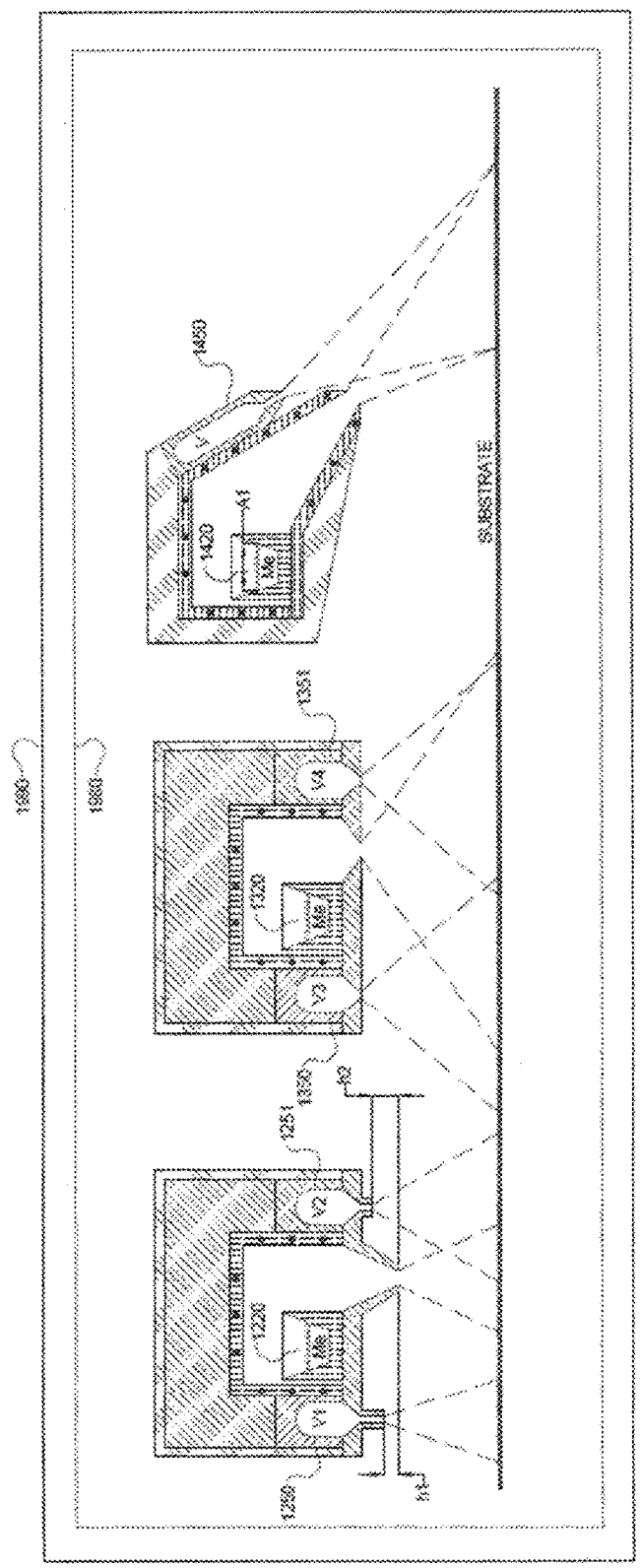
FIGS. 1A-1B are orthographic projection views of a machine in accordance with an embodiment of the present disclosure.

Embodiments presented in the present disclosure and the various features and advantageous details thereof are explained more fully with reference to the nonlimiting embodiments that are illustrated in the accompanying drawings and detailed in the following description. Descriptions of well-known materials, techniques, components and equipment are omitted so as not to unnecessarily obscure the embodiments of the present disclosure in detail. It should be understood, however, that the detailed description and the specific examples are given by way of illustration only and not by way of limitation. Various substitutions, modifications, additions and/or rearrangements within the scope of the underlying inventive concept will become apparent to those skilled in the art from this disclosure.

The disclosure of this application is technically related to copending U.S. Ser. No(s). 63/161,033, filed Mar. 15, 2021; U.S. Ser. No(s). 63/161,043, filed Mar. 15, 2021; and U.S. Ser. No(s). 63/161,047, filed Mar. 15, 2021.

An embodiment can include a method, comprising: directing a first flux plume from a first evaporation source to a first reactive codeposition zone; directing a first vapor flux plume from a first vapor distribution manifold to the first reactive codeposition zone wherein the first vapor distribution manifold is integrated with the first evaporation source to form a first integrated evaporation and vapordistribution manifold; directing a second flux plume from a second evaporation source to a second reactive codeposition zone; and directing a second vapor flux plume(s) from a second vapor distribution manifold(s) to the second reactive codeposition zone wherein the second vapor distribution manifold is integrated with the second evaporation source to form a second integrated evaporation and vapor distribution manifold.

An embodiment can include the method where the first integrated evaporation and vapor distribution manifold defines a first form factor and the second integrated evaporation and vapor distribution manifold defines a second form factor.

An embodiment can include the method where the first form factor and the second form factor are substantially identical.

An embodiment can include the method where the first integrated evaporation and vapor distribution manifold and the second integrated evaporation and vapor distribution manifold are reversibly interchangeably located within an inline reactive codeposition modular multi-flux evaporative source with an integrated vapor manifold system.

An embodiment can include the method further comprising exchanging the first integrated evaporation and vapor distribution manifold and the second integrated evaporation and vapor distribution manifold within the inline reactive codeposition modular multi-flux evaporative source with integrated vapor manifold system.

An embodiment can include the method further comprising emitting the first flux plume through a first metal distribution nozzle on the first evaporation source.

An embodiment can include the method further comprising emitting the second flux plume through a second metal distribution nozzle on the second evaporation source.

An embodiment can include the method further comprising emitting the first vapor plume through a first vapor distribution nozzle on the first vapor distribution manifold.

An embodiment can include the method further comprising emitting the second vapor plume through a second vapor distribution nozzle 1352, 1353, 1452 on the second vapor distribution manifold.

An embodiment can include the method further comprising heating an aperture of the first evaporation source using a first lip heater on the first evaporation source.

An embodiment can include the method further comprising heating an aperture of the second evaporation source using a second lip heater on the second evaporation source.

An embodiment can include the method further comprising heating a first crucible 2220 located within the first evaporation source using a first source heater located within the first evaporation source.

An embodiment can include the method further comprising heating a second crucible 2320 located within the second evaporation source using a second source heater located within the second evaporation source An embodiment can include the method further comprising providing a first starting composition located in the first evaporation source, a second starting composition located in the second evaporation source a third composition located in the first vapor distribution manifold and a fourth composition located in the second vapor distribution manifold.

An embodiment can include an apparatus for performing the method.

An embodiment can include an article of manufacture made in accordance with the method.

An embodiment can include an assembly, comprising an article of manufacture made in accordance with the method.

An embodiment can include a coating made by the method.

An embodiment can include an apparatus, comprising: an inline reactive codeposition modular multi-flux evaporative source with integrated vapor manifold system comprising a first integrated evaporation and vapor distribution manifold including a first evaporation source emitting, when in operation, a first flux plume toward a first reactive codeposition zone; and a first vapor distribution manifold integrated with the first evaporation source, the vapor distribution manifold emitting, when in operation a first vapor flux plume toward the first reactive codeposition zone; and a second integrated evaporation and vapor distribution manifold including a second evaporation source coupled to the first evaporation source, the second evaporation source emitting, when in operation, a second flux plume toward a second reactive codeposition zone; and a second vapor distribution manifold integrated with the second evaporation source, the second vapor distribution manifold emitting, when in operation a second vapor flux plume toward the second reactive codeposition zone.

An embodiment can include the apparatus where the first integrated evaporation and vapor distribution manifold defines a first form factor and the second integrated evaporation and vapor distribution manifold defines a second form factor, An embodiment can include the apparatus where the first form factor and the second form factor are substantially identical.

An embodiment can include the apparatus where the first integrated evaporation and vapor distribution manifold and the second integrated evaporation and vapor distribution manifold are reversibly interchangeably located within the linear evaporation reactive codeposition system.

An embodiment can include the apparatus further comprising a first graphite surface on the first integrated evaporation and vapor distribution manifold.

An embodiment can include the apparatus further comprising a second graphite surface on the second integrated evaporation and vapor distribution manifold.

An embodiment can include the apparatus further comprising a first metal distribution nozzle on the first evaporation source.

An embodiment can include the apparatus further comprising a second metal distribution nozzle on the second evaporation source.

An embodiment can include the apparatus further comprising a first vapor distribution nozzle on the first vapor distribution manifold.

An embodiment can include the apparatus further comprising a second vapor distribution nozzle on the second vapor distribution manifold.

An embodiment can include the apparatus further comprising a first lip heater on the first evaporation source.

An embodiment can include the apparatus further comprising a second lip heater on the second evaporation source.

An embodiment can include the apparatus further comprising a first source heater within the first evaporation source.

An embodiment can include the apparatus further comprising a second source heater within the second evaporation source.

An embodiment can include a deposition chamber 1990, 2990 comprising the apparatus. The deposition zone shielding 1980, 2980 can be located within the vacuum deposition chamber 1990, 2990.

In general, the context of an embodiment of the present disclosure can include manufacture of semiconductor alloys, superconductor alloys, or other multinary functional coatings. For example, the context of an embodiment of the present disclosure can include manufacture of the (Ag,Cu)(In,Ga)(S,Se) material system on substrates for solar photovoltaic modules.

Embodiments of this disclosure address the deficiencies of conventional approaches by incorporating several distinct innovative yet generic features which offer a broad range of implementation options that can be optimally combined to accommodate differences in product and coating material compositions, structures, and functional requirements, as well as their appropriate reactive codeposition precursors' thermochemical properties. Examples of relevant feature selection and optimization considerations will be provided herein using the example of reactive codeposition of semiconductor alloys from the (Ag,Cu)(In,Ga)(S,Se) material system (hereafter ACIGS) on substrates for solar photovoltaic module manufacturing. When operating inline coating tools for deposition onto many substrates it is important to limit their temperature during growth to avoid excessive mechanical distortion or residual stress upon cooldown due to different thermal expansion rates. In the temperature range where evaporated vapor fluxes of these elements react on the substrate surface to provide high quality ACIGS semiconductor properties, the metal vapors (Ag, Cu, In, Ga) completely condense onto the substrate, whereas the semimetal chalcogen (Se and S) vapors will not stick to any hot surface unless they react with evaporated metals. Since the quality of the ACIGS is poor unless the chalcogen vapor flux is greater than the amount incorporated into the film, a background pressure of their vapor must be maintained in the reaction vessel. This background pressure reduces the mean free paths (MFP) of all gas phase species in the reactor, and when its value approaches or exceeds the distance between the sources' reactant flux distribution outlets and the product substrate, molecular scattering can reduce the fraction of reactants incorporated into the product coating (collection efficiency), thereby wasting raw materials that form debris-generating coatings on the interior walls of the reactor vessel instead. Reactor design optimization seeks to maximize coating deposition rate and precursor collection efficiency while minimizing background pressure as much as possible to achieve both high coating quality and productivity.

One innovation achieves these goals by integrating distribution manifold(s) into the sides of the metal source with design features that both align the fluxes to make them substantially colinear and maximize the uniformity of the reactant ratios within the range that optimizes product quality. By integrating the manifolds, waste heat from the metal source is used to prevent condensation of the lower evaporation temperature material (e.g. selenium). This dramatically decreases the overall space within the reactor occupied by the combination of metal and selenium sources. The smaller overall size results in less energy required to heat the sources and less energy transferred to the system and the substrates. The reduced energy results in lower operational costs but the bigger benefit is better control of substrate temperature by minimizing overheating, less overall surface area for debris accumulation to take place, closer spacing of adjacent metal sources, and more thorough and homogeneous reaction of the co-deposited materials. Another benefit is additional thermal dissociation of the reactive molecular selenium vapor which increases reaction rate and material utilization.

Another key feature of this innovation is the aggregation of a multiplicity of these integrated reactive flux distribution manifolds into assemblies to achieve greater deposition thickness within an individual reactor chamber and/or the deposition of alloys using fluxes of different metals and or volatile reactants (such as the chalcogens in the ACIGS example) from distinct metal sources within the assembly. These different sources may incorporate various detailed features, examples of which are shown in FIGS. 1A-1B and 2A-2B, to optimize each for the coating composition and reactant ratios required to achieve the product coating's desired functional properties, including but not limited to alloy composition gradients.

One novel feature of the innovation is the integration of colinear nonvolatile and volatile reactant flux delivery manifolds to minimize their large-angle scattering due to their mixing and thus reduce debris generation. Another novel feature is the assembly of a multiplicity of these integrated reactive codeposition manifolds into a coupled assembly to increase their conductive thermal heat sharing and thereby reduce their heat loss to other regions of the reactor chamber while increasing flux overlap compared to separating them while maximizing collection efficiency.

Embodiments of the disclosure can include a metal source composed of one or more crucibles, heated by one or more heaters, within a housing that directs the evaporated material towards the substrate integrated with volatile reactant flux distribution manifolds that colinearize those fluxes to minimize large-angle scattering while sharing common heating sources to reduce overall power input requirements. Assembly of multiple integrated reactive codeposition sources with each optimized to maximize the quality and transverse uniformity of the deposition of nonvolatile reactants and their ratio with each other and volatile reactants at the surface of the coating during its growth.

When operating under conditions where the mean free path of any of the metal reactants is longer than the characteristic dimensions within the interior of any of the illustrative metal sources in FIGS. 1A-1B and 2A-2B, the flux exiting its aperture comes predominately from that Me-source's internal surfaces which are within the direct field of view of that aperture.

Figure 1B:
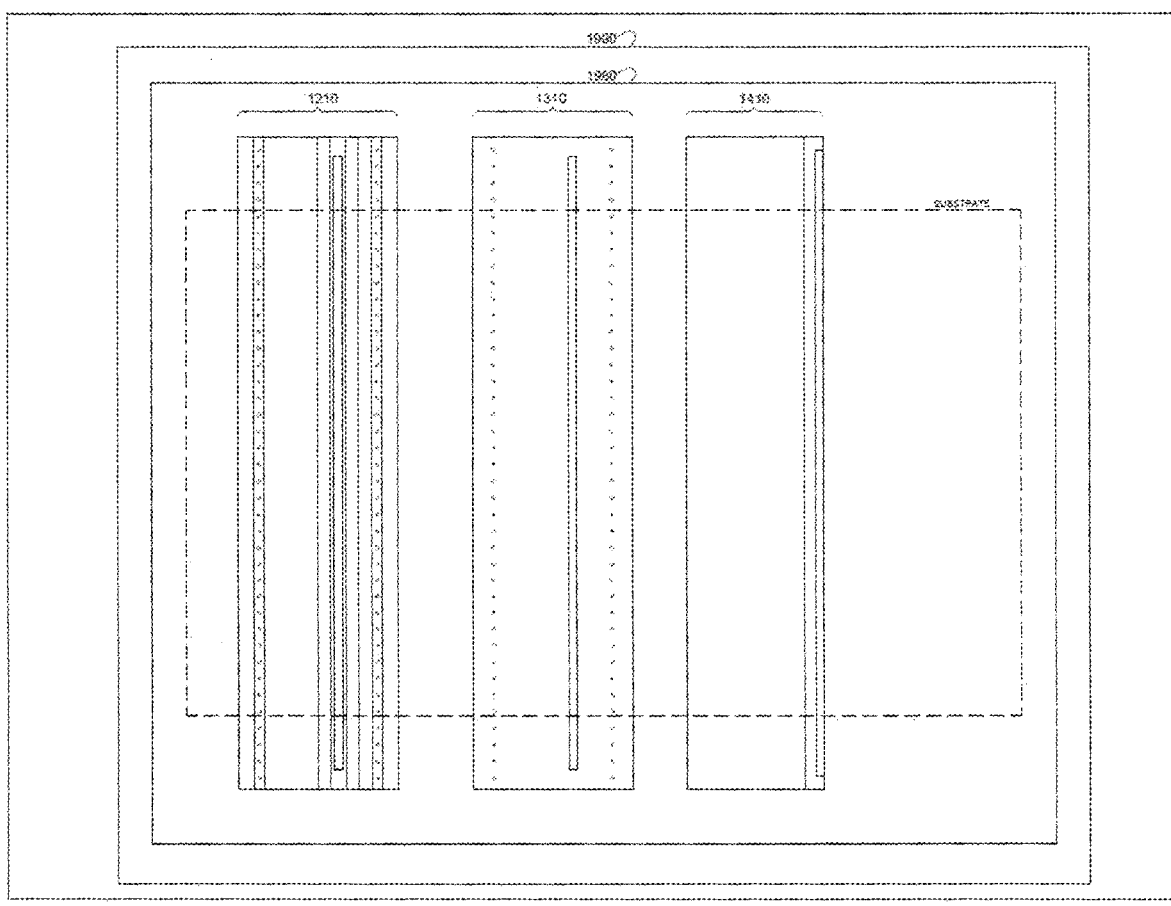

FIGS. 1A-1B illustrate three different examples incorporating key innovations of embodiments of this disclosure. Comparing the middle and leftmost integrated multi-reactant source cross-sections in FIGS. 1A-1B it can be appreciated that the field of view of the middle source in which the exit apertures of both Me 1320 and V3-V4 1350-1351 vapor distribution nozzles crosses the flux exiting the latter at a shallower angle and thus in a region where the flux plume from V3 1350 and V4 1351 are much more concentrated, leading to increased scattering that can result in the growth of coatings on the bottom surface of the source. In the leftmost example, the Me 1220 aperture lip heaters are extended below the bottom surface by a distance h2 that is greater than the distance h1 that the V1 1250 and V2 1251 vapor distribution nozzles extend below that surface. The metal flux crosses the vapor flux plumes at a greater distance below the latter's nozzles, where both fluxes are less concentrated, thus reducing upward scattering onto the surfaces within the reactor which lie above the deposition substrates, creating a risk of falling debris and resultant coating defect formation. Finally, comparing the rightmost exemplary integrated reactant source and vapor distribution manifold having Me 1420 and V 1450 with the other two it is evident that in this configuration the collinearity of metal and vapor flux plumes is increased, further reducing the backscattering of metal flux onto the angled bottom surface of the source. FIG. 1B shows integrated metal vapor source 1210, integrated metal vapor source 1310, and integrated metal vapor source 1410.

Figure 2A:
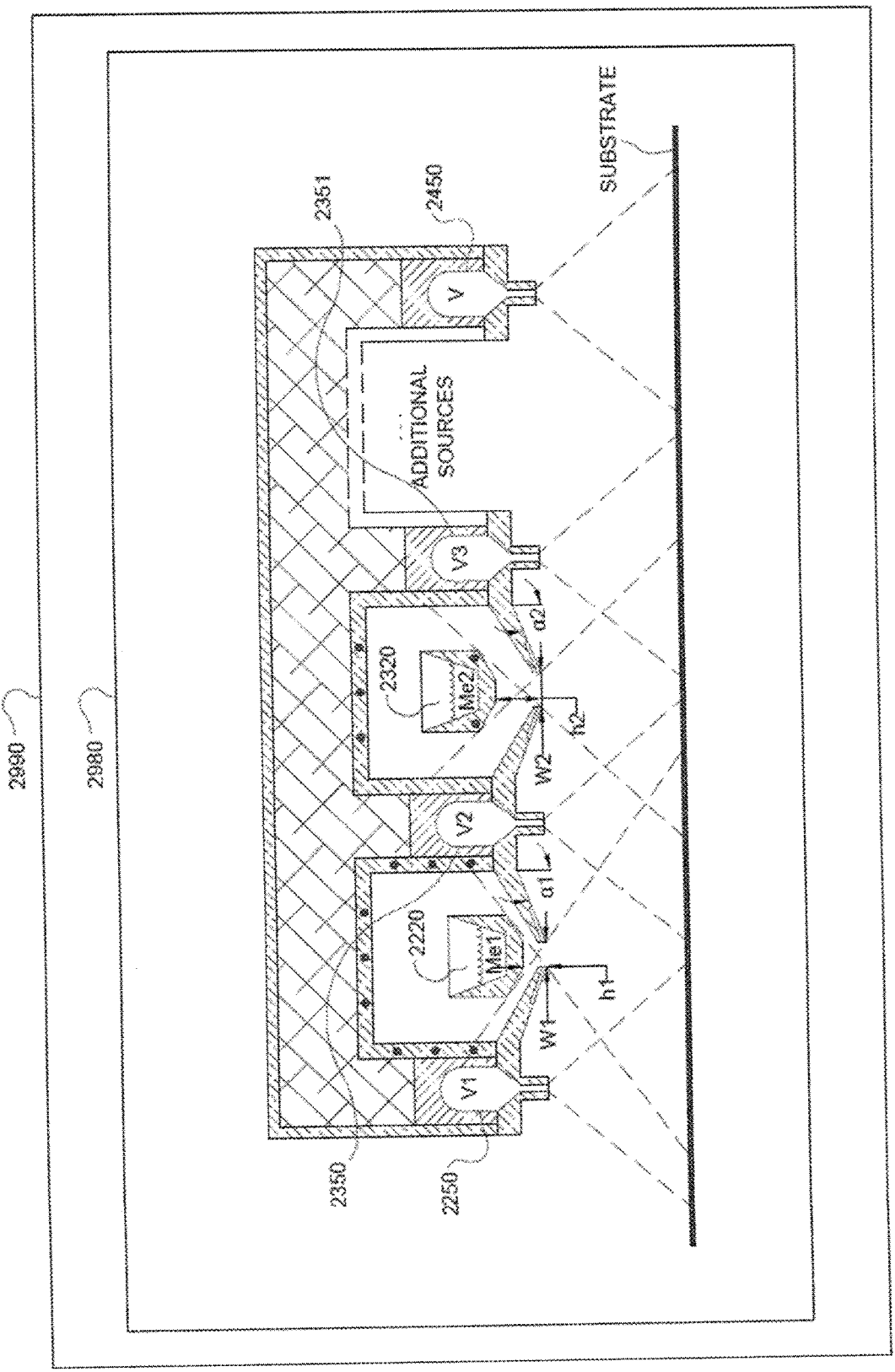
FIGS. 2A-2B are orthographic projection views of a machine in accordance with an embodiment of the present disclosure.
Figure 2B:
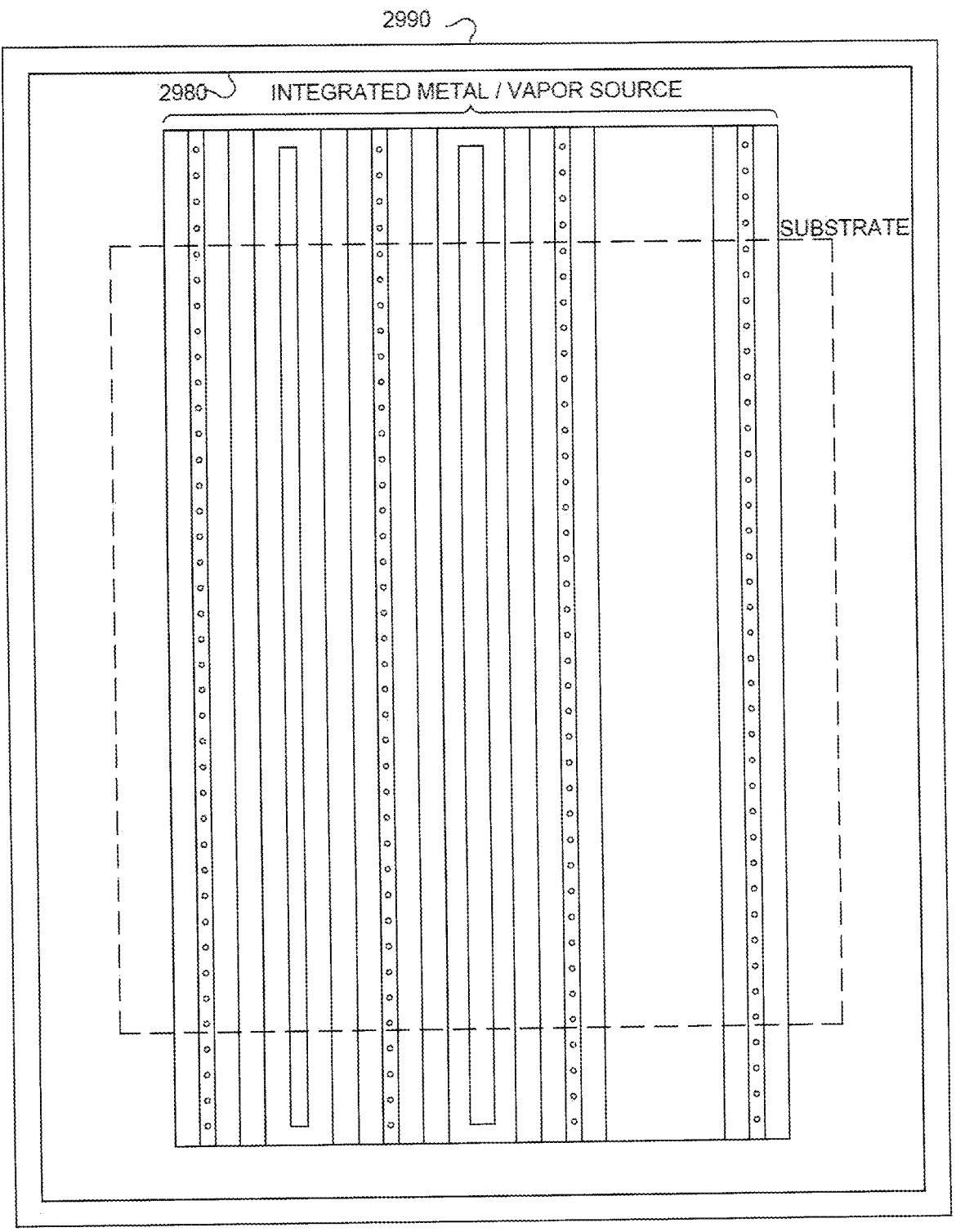

Comparing the different configurations of Me1 2220 and Me2 2320 melt crucibles within the assembly shown in FIGS. 2A-2B, it can be appreciated that both the wider aperture in Me2 2320 (width W2>W1) and the higher positioning of its crucible (height h2>h1) within the otherwise identical interior configuration creates a larger total visible interior surface area from the exterior, distributing the flux from Me2 2320 over a larger surface area at the plane of the substrate on which the coating is grown. If they operate at the same temperature and have the same free melt surface area, the total evaporation rate from each sources aperture into the reaction zone is comparable, but the flux density incident on the surface below Me2 2320 is lower than that at the same angle in the field of view of Me1 2220. Thus, by adjusting the crucible height of the otherwise identical sources in this example, the flux density profile at the growth surface may be modified to reduce scattering within the volume between the source and substrate. FIG. 2A shows V1 2250, V2 2350, V3 2351and V 2450.

An embodiment of the present disclosure can also be included in a kit-of-parts. The kit-of-parts can include some, or all, of the components that an embodiment of the present disclosure includes. The kit-of-parts can be an in-the-field retrofit kit-of-parts to improve existing systems that are capable of incorporating an embodiment of the present disclosure. The kit-of-parts can include software, firmware and/or hardware for carrying out an embodiment of the present disclosure. The kit-of-parts can also contain instructions for practicing an embodiment of the present disclosure. Unless otherwise specified, the components, software, firmware, hardware and/or instructions of the kit-of-parts can be the same as those used in an embodiment of the present disclosure.

An embodiment of the present disclosure can also utilize data processing methods that transform signals from sensors and/or transducers to machine control signals. For example, an embodiment of the present disclosure can be combined with instrumentation to obtain state variable information to actuate interconnected discrete hardware elements. For instance, an embodiment of the present disclosure can include the use of temperature data to control machine configuration and/or operational parameters.

Practical Applications

A practical application of an embodiment of the present disclosure that has value within the technological arts is co-evaporation of thin film devices. Further, an embodiment of the present disclosure is useful in conjunction with co-evaporation of the (Ag,Cu)(In,Ga)(S,Se) material system (that is used for the purpose of generating electricity), or in conjunction with co-evaporation of super conductors (such as are used for the purpose of conducting electricity with no resistance), or the like. There are virtually innumerable uses for embodiments of the present disclosure, all of which need not be detailed here.

Definitions

The term compound is intended to mean a substance formed when two or more chemical elements are chemically bonded together, the elements present in ratios with a limited range of variation and characteristic crystal structure. The term phase is intended to mean a limited range of compositions of a mixture of the elements (in a thermochemical system) throughout which the chemical potential of the mixture varies with composition, and which either changes discontinuously or remains constant outside of that range. The phrase cation content is intended to mean the percentage or relative amount of a given cation of interest (relative to total number of atoms) in a given volume or mass of interest. The selenium atoms are not cations, they are technically anions and cation content is normalized to the total number of atoms in the film per unity volume. The term absorber is intended to mean the photon absorbing portion of a photovoltaic device which can generate current in operation. Other parts of the cell also absorb light but if they cannot generate current this is called "parasitic absorption". The term buffer is intended to mean the junction forming region of a photovoltaic. The term emitter is intended to mean the negative contact of an illuminated photovoltaic without current flow. The term amorphous transparent conductive layer is intended to mean a non-crystalline, substantially photon transparent, electronically conducting portion of a photovoltaic. The term back contact is intended to mean the contact of a photovoltaic on the side opposite the incident illumination. The term photovoltaic is intended to mean an article of manufacture for the generation of a voltage when radiant energy falls on the boundary between dissimilar substances (as two different semiconductors).

The term vapor distribution manifold is intended to mean the distribution manifold of a vapor (evaporation source) source. The term uniformly is intended to mean unvarying or deviating very little from a given and/or expected value (e.g, within 10% of). The term substantially is intended to mean largely but not necessarily wholly that which is specified. The term approximately is intended to mean at least close to a given value (e.g., within 10% of). The term generally is intended to mean at least approaching a given state. The term coupled is intended to mean connected, although not necessarily directly, and not necessarily mechanically. The term proximate, as used herein, is intended to mean close, near adjacent and/or coincident; and includes spatial situations where specified functions and/or results (if any) can be carried out and/or achieved. The term distal, as used herein, is intended to mean far, away, spaced apart from and/or non-coincident, and includes spatial situation where specified functions and/or results (if any) can be carried out and/or achieved. The term deploying is intended to mean designing, building, shipping, installing and/or operating.

The terms first or one, and the phrases at least a first or at least one, are intended to mean the singular or the plural unless it is clear from the intrinsic text of this document that it is meant otherwise. The terms second or another, and the phrases at least a second or at least another, are intended to mean the singular or the plural unless it is clear from the intrinsic text of this document that it is meant otherwise. Unless expressly stated to the contrary in the intrinsic text of this document, the term or is intended to mean an inclusive or and not an exclusive or. Specifically, a condition A or B is satisfied by any one of the following: A is true (or present) and B is false (or not present), A is false (or not present) and B is true (or present), and both A and B are true (or present). The terms a and/or an are employed for grammatical style and merely for convenience.

The term plurality is intended to mean two or more than two. The term any is intended to mean all applicable members of a set or at least a subset of all applicable members of the set. The phrase any integer derivable therein is intended to mean an integer between the corresponding numbers recited in the specification. The phrase any range derivable therein is intended to mean any range within such corresponding numbers. The term means, when followed by the term "for" is intended to mean hardware, firmware and/or software for achieving a result. The term step, when followed by the term "for" is intended to mean a (sub) method, (sub) process and/or (sub) routine for achieving the recited result. Unless otherwise defined, all technical and scientific terms used herein have the same meaning as commonly understood by one of ordinary skill in the art to which this present disclosure belongs. In case of conflict, the present specification, including definitions, will control.

The described embodiments and examples are illustrative only and not intended to be limiting. Although embodiments of the present disclosure can be implemented separately, embodiments of the present disclosure may be integrated into the system(s) with which they are associated. All the embodiments of the present disclosure disclosed herein can be made and used without undue experimentation in light of the disclosure. Embodiments of the present disclosure are not limited by theoretical statements (if any) recited herein. The individual steps of embodiments of the present disclosure need not be performed in the disclosed manner, or combined in the disclosed sequences, but may be performed in any and all manner and/or combined in any and all sequences. The individual components of embodiments of the present disclosure need not be formed in the disclosed shapes, or combined in the disclosed configurations, but could be provided in any and all shapes, and/or combined in any and all configurations. The individual components need not be fabricated from the disclosed materials, but could be fabricated from any and all suitable materials. Homologous replacements may be substituted for the substances described herein. Agents which are chemically related may be substituted for the agents described herein where the same or similar results would be achieved.

Various substitutions, modifications, additions and/or rearrangements of the features of embodiments of the present disclosure may be made without deviating from the scope of the underlying inventive concept. All the disclosed elements and features of each disclosed embodiment can be combined with, or substituted for, the disclosed elements and features of every other disclosed embodiment except where such elements or features are mutually exclusive. The scope of the underlying inventive concept as defined by the appended claims and their equivalents cover all such substitutions, modifications, additions and/or rearrangements.

The appended claims are not to be interpreted as including means-plus-function limitations, unless such a limitation is explicitly recited in a given claim using the phrase(s) "means for" or "mechanism for" or "step for". Sub-generic embodiments of this disclosure are delineated by the appended independent claims and their equivalents. Specific embodiments of this disclosure are differentiated by the appended dependent claims and their equivalents.

What is claimed is:

1. An apparatus, comprising:
    an inline reactive codeposition modular multi-flux evaporative source with integrated vapor manifold system comprising
        a first integrated evaporation and vapor distribution manifold including
            a first evaporation source comprising a first melt crucible and a first metal distribution nozzle that distributes metal from the first melt crucible, the first evaporation source emitting, when in operation, a first flux plume from the first metal distribution nozzle toward a first reactive codeposition zone on a substrate; and
            a first vapor distribution manifold coupled to a first external source material reservoir that is not part of an internal volume of the inline reactive codeposition modular multi-flux evaporative source, the first vapor distribution manifold comprising a first vapor nozzle that distributes vapor from the first external source material reservoir, the first vapor distribution manifold integrated with the first evaporation source, the vapor distribution manifold emitting, when in operation, a first vapor flux plume from the first vapor nozzle toward the first reactive codeposition zone on the substrate; and
        a second integrated evaporation and vapor distribution manifold including a second evaporation source coupled to the first evaporation source, the second evaporation source comprising a second melt crucible and a second metal distribution nozzle that distributes metal from the second melt crucible, the second evaporation source emitting, when in operation, a second flux plume from the second metal distribution nozzle toward a second reactive codeposition zone on the substrate; and
            a second vapor distribution manifold coupled to a second external source material reservoir that is not part of the internal volume of the inline reactive codeposition modular multi-flux evaporative source, the second vapor distribution manifold comprising a second vapor nozzle that distributes vapor from the second external source material reservoir, the second vapor distribution manifold integrated with the second evaporation source, the second vapor distribution manifold emitting, when in operation a second vapor flux plume from the second vapor nozzle toward the second reactive codeposition zone on the substrate.

2. The apparatus of claim 1, wherein the first integrated evaporation and vapor distribution manifold defines a first form factor and the second integrated evaporation and vapor distribution manifold defines a second form factor.

3. The apparatus of claim 2, wherein the first form factor and the second form factor are substantially identical.

4. The apparatus of claim 3, wherein the first integrated evaporation and vapor distribution manifold and the second integrated evaporation and vapor distribution manifold are reversibly interchangeably located within the inline reactive codeposition modular multi-flux evaporative source.

5. The apparatus of claim 1, further comprising a first graphite surface on the first integrated evaporation and vapor distribution manifold.

6. The apparatus of claim 5, further comprising a second graphite surface on the second integrated evaporation and vapor distribution manifold.

7. The apparatus of claim 1, further comprising a first lip heater on the first evaporation source.

8. The apparatus of claim 7, further comprising a second lip heater on the second evaporation source.

9. The apparatus of claim 1, further comprising a first source heater within the first evaporation source.

10. The apparatus of claim 9, further comprising a second source heater within the second evaporation source.

11. A deposition chamber comprising the apparatus of claim 1 and deposition zone shielding.

\* \* \* \* \*